United States Patent
Cebuhar et al.

(10) Patent No.: US 7,567,368 B2
(45) Date of Patent: Jul. 28, 2009

(54) SYSTEMS AND METHODS FOR MINIMIZING SCATTERED LIGHT IN MULTI-SLM MASKLESS LITHOGRAPHY

(75) Inventors: Wenceslao A. Cebuhar, Norwalk, CT (US); Jason D. Hintersteiner, Bethel, CT (US); Stan Janik, Naugatuck, CT (US); Yuli Vladimirsky, Weston, CT (US)

(73) Assignee: ASML Holding N.V., Veldhoven (NL)

( * ) Notice: Subject to any disclaimer, the term of this patent is extended or adjusted under 35 U.S.C. 154(b) by 266 days.

(21) Appl. No.: 11/029,724

(22) Filed: Jan. 6, 2005

(65) Prior Publication Data
US 2006/0146308 A1    Jul. 6, 2006

(51) Int. Cl.
*G02F 1/00* (2006.01)
(52) U.S. Cl. .................. 359/237; 359/738; 359/259; 359/290
(58) Field of Classification Search .................. 359/237, 359/738, 238, 278
See application file for complete search history.

(56) References Cited

U.S. PATENT DOCUMENTS

| | | | |
|---|---|---|---|
| 5,229,872 A | 7/1993 | Mumola | 359/40 |
| 5,296,891 A | 3/1994 | Vogt et al. | 355/67 |
| 5,500,736 A | 3/1996 | Koitabashi et al. | |
| 5,523,193 A | 6/1996 | Nelson | 430/311 |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,191,880 B1 | 2/2001 | Schuster | |
| 6,448,999 B1 | 9/2002 | Utterback et al. | |
| 6,617,572 B2 * | 9/2003 | Ishizuka | 250/237 G |
| 6,687,041 B1 | 2/2004 | Sandstrom | |
| 6,747,783 B1 | 6/2004 | Sandstrom | |
| 6,795,169 B2 | 9/2004 | Tanaka et al. | |

(Continued)

FOREIGN PATENT DOCUMENTS

JP    53-29277 U    3/1978

(Continued)

OTHER PUBLICATIONS

Translation of Notification of Reason for Refusal for Japanese Patent Application No. 2006-001391 mailed Nov. 25, 2008, 2 pgs.

(Continued)

*Primary Examiner*—Jessica T Stultz
(74) *Attorney, Agent, or Firm*—Sterne, Kessler, Goldstein & Fox P.L.L.C.

(57) ABSTRACT

The present invention is directed to a lithography system in which scattered light from a pattern generator, having one or more pattern generating devices, is blocked from an object, such as a wafer or display. The system includes a pattern generator with multiple pattern generating devices, a projection system for directing light from the pattern generating device, and an aperture located at or near an object window. The aperture has a profile that matches the configuration of the pattern generating devices. A method for blocking scattered light in a lithography system using multiple pattern generating devices is also provided.

10 Claims, 8 Drawing Sheets

U.S. PATENT DOCUMENTS

| | | |
|---|---|---|
| 6,806,897 B2 | 10/2004 | Kataoka et al. |
| 6,811,953 B2 | 11/2004 | Hatada et al. |
| 7,006,295 B2 * | 2/2006 | Coston et al. ............... 359/619 |
| 7,023,525 B2 * | 4/2006 | Bleeker et al. ................ 355/65 |
| 7,184,610 B2 * | 2/2007 | Weinstein et al. ........... 382/284 |
| 2004/0041104 A1 | 3/2004 | Liebregts et al. |
| 2004/0130561 A1 | 7/2004 | Jain |
| 2004/0246559 A1 * | 12/2004 | Tamada et al. .............. 359/291 |
| 2005/0007572 A1 | 1/2005 | George et al. |

FOREIGN PATENT DOCUMENTS

| | | |
|---|---|---|
| JP | 57-188824 A | 11/1982 |
| JP | 9-184918 A | 7/1997 |
| JP | 2000-206703 A | 7/2000 |
| WO | WO 98/33096 | 7/1998 |
| WO | WO 98/38597 | 9/1998 |

OTHER PUBLICATIONS

Notification of Reasons for Refusal for Japanese Patent Application No. 2006-001391 mailed Dec. 24, 2008, 3 pgs.

* cited by examiner

SYSTEMS AND METHODS FOR MINIMIZING SCATTERED LIGHT IN MULTI-SLM MASKLESS LITHOGRAPHY

BACKGROUND OF THE INVENTION

1. Field of the Invention

The present invention relates to lithography, and more particularly, to maskless lithography involving one or more pattern generating devices.

2. Background of Invention

Lithography systems are used to print features in a variety of manufacturing applications. Photolithography systems use a mask or reticle to expose features onto an object. In semiconductor manufacturing, for example, a reticle is exposed by an exposure beam. An optical system then projects a reduced image of the reticle onto a silicon wafer. In this way, circuit features can be printed on a semiconductor substrate.

Maskless lithography systems have been developed that do not require use of a mask or reticle. Current maskless lithography systems project a pattern to be printed onto a moving object. For example, a pattern of circuit features can be projected onto a moving wafer or flat panel display. In one example, a silicon wafer can be coated with a photoresist. The pattern is projected on the wafer using one or more pattern generating devices, such as one or more spatial light modulators (SLM). Types of SLMs can include, for example, digital micromirror devices (DMD), transmissive liquid crystal light valves (LCLV), and grating light valves (GLV).

In maskless lithography involving multiple pattern generating devices, such as multi-SLM maskless lithography, multiple SLMs are typically used in a flat plan to generate a pattern onto a work surface, such as a wafer or flat panel display. Relatively large gaps can exist between SLMs in a multi-SLM maskless lithography system. These gaps lead to a large amount of scattered light reaching a wafer in areas between the active portions of the SLMs, which should remain dark. Improper dose control and loss of contrast in the wafer imaging, for example, can result that leads to degraded imaging and reduced circuit performance for the device being produced.

What are needed are systems and methods for minimizing scattered light in multi-pattern generating device maskless lithography systems.

SUMMARY OF THE INVENTION

The present invention is directed to a lithography system in which scattered light from pattern generating devices, such as an SLMs, is blocked from an object, such as a wafer or display. The system includes a pattern generator with one or more pattern generating devices, a projection system for directing light from the pattern generating device, and an aperture located at or near an object window. The aperture has a profile that matches the configuration of the pattern generating devices. A method for blocking scattered light in a lithography system using multiple pattern generating devices is also provided.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

Figure 1:
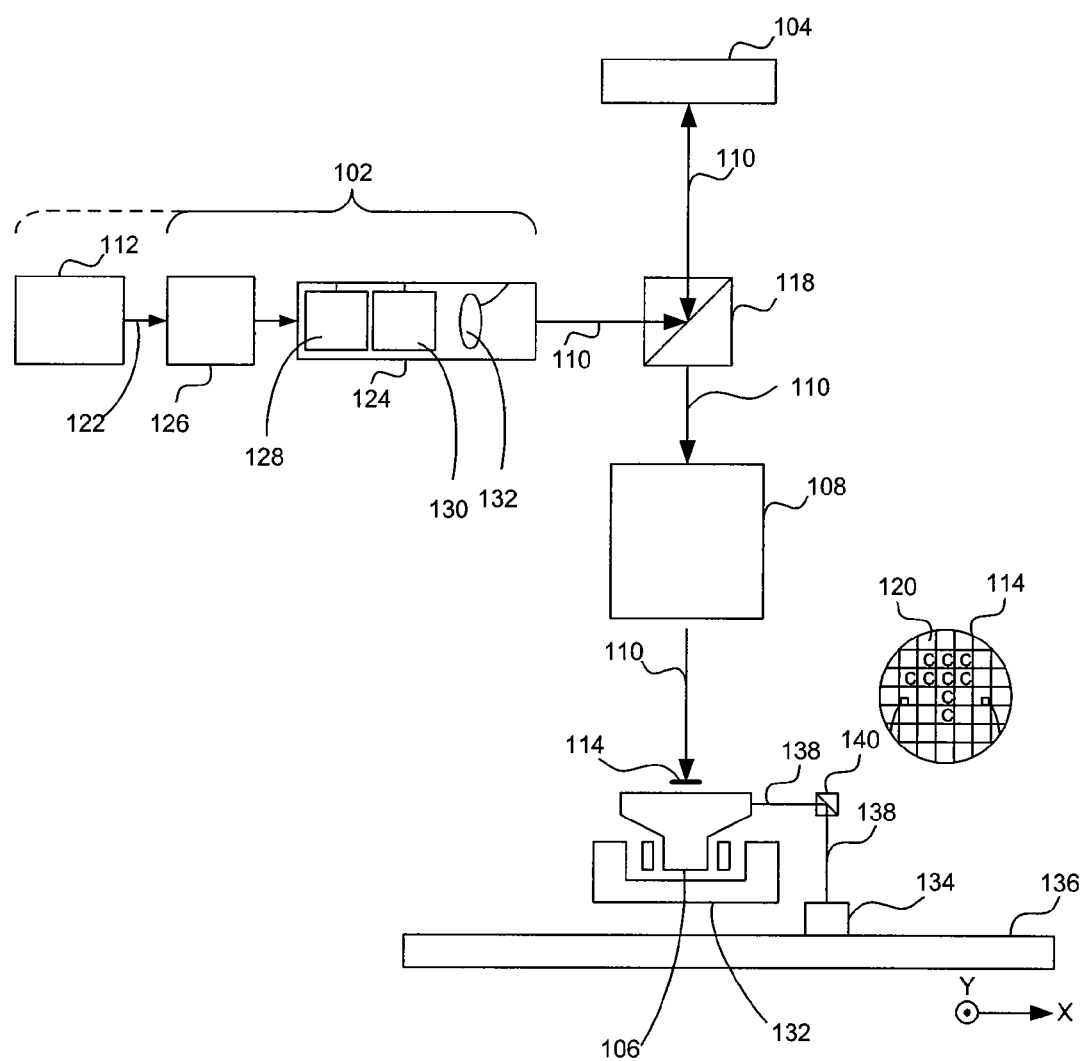
FIG. 1 is a diagram of a lithographic projection apparatus, according to an embodiment of the invention.

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

The term "pattern generator" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the pattern generator can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the pattern generator may differ substantially from the pattern eventually transferred to a layer of or on the substrate. Similarly, the pattern eventually generated on the substrate may not correspond to the pattern formed at any one instant on the pattern generator. This may be the case in an arrangement in which the eventual pattern formed on each part of the substrate is built up over a given period of time or a given number of exposures during which the pattern on the pattern generator and/or the relative position of the substrate changes.

Although specific reference may be made in this text to the use of lithographic apparatus in the manufacture of ICs, it should be understood that the lithographic apparatus and projection systems described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" and "light ray" used herein encompass all types of electromagnetic radiation, including ultraviolet (UV) radiation (e.g. having a wavelength of 365, 248, 193, 157 or 126 nm) and extreme ultraviolet (EUV) radiation (e.g. having a wavelength in the range of 5-20 nm), as well as particle beams, such as ion beams or electron beams.

The illumination system may also encompass various types of optical components, including refractive, reflective, diffractive, and catadioptric optical components for directing, shaping, or controlling the projection beam of radiation.

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the SLM and the first element of the projection system. Immersion techniques are well known in the art for increasing the numerical aperture of projection systems.

FIG. 1 is a diagram of lithographic projection apparatus 100, according to an embodiment of the invention. Apparatus 100 includes at least a radiation system 102, pattern generator 104, an object table 106 (e.g., a substrate table), and an projection system 108.

Radiation system 102 can be used for supplying a projection beam 110 of radiation (e.g., UV radiation), which in this particular case also comprises a radiation source 112.

A pattern generator 104 (e.g., spatial light modulator) can be used for applying a pattern to projection beam 110. In general, the position of pattern generator 104 can be fixed relative to projection system 108. However, in an alternative arrangement, pattern generator 104 may be connected to a positioning device (not shown) for accurately positioning it with respect to projection system 108. As here depicted, pattern generator 104 is of a reflective type (e.g., has a reflective array of individually controllable elements).

Object table 106 can be provided with a substrate holder (not specifically shown) for holding a substrate 114 (e.g., a resist coated silicon wafer or glass substrate) and object table 106 can be connected to a positioning device (not shown) for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of pattern generator 104 onto substrate 114. Alternatively, projection system 108 may project images of secondary sources for which the elements of pattern generator 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, projection beam 110 impinging on pattern generator 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts pattern generator 104 after being directed using beam splitter 118. Having been reflected by pattern generator 104, beam 110 passes through projection system 108, which focuses beam 110 onto a target portion 120 of the substrate 114.

With the aid of positioning device (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the pattern generator 104 can be used to accurately correct the position of pattern generator 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position pattern generator 104. It will be appreciated that projection beam 110 may alternatively/additionally be moveable, while object table 106 and/or pattern generator 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned projection beam 110 for use in resistless lithography.

The depicted apparatus 100 can be used in four preferred modes:

1. Step mode: the entire pattern from pattern generator 104 is projected in one go (i.e., a single "flash") onto a target portion 120. Substrate table 106 is then moved in the x and/or y directions to a different position for a different target portion 120 to be irradiated by patterned projection beam 110.

2. Scan mode: essentially the same as step mode, except that a given target portion 120 is not exposed in a single "flash." Instead, pattern generator 104 is movable in a given direction (the so-called "scan direction", e.g., the y direction) with a speed v, so that patterned projection beam 110 is caused to scan over pattern generator 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned projection beam 110 is caused to scan a line across substrate 106. The pattern on pattern generator 104 is updated as required between pulses of radiation system 102 and the pulses are timed such that successive target portions 120 are exposed at the required locations on substrate 114. Consequently, patterned projection beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on pattern generator 104 is updated as patterned projection beam 110 scans across substrate 114 and exposes it.

5. Pixel Grid Imaging Mode: the pattern formed on substrate 114 is realized by subsequent exposure of spots formed by a spot generator that are directed onto array 104. The exposed spots have substantially the same shape. On substrate 114 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use may also be employed.

Figure 2:
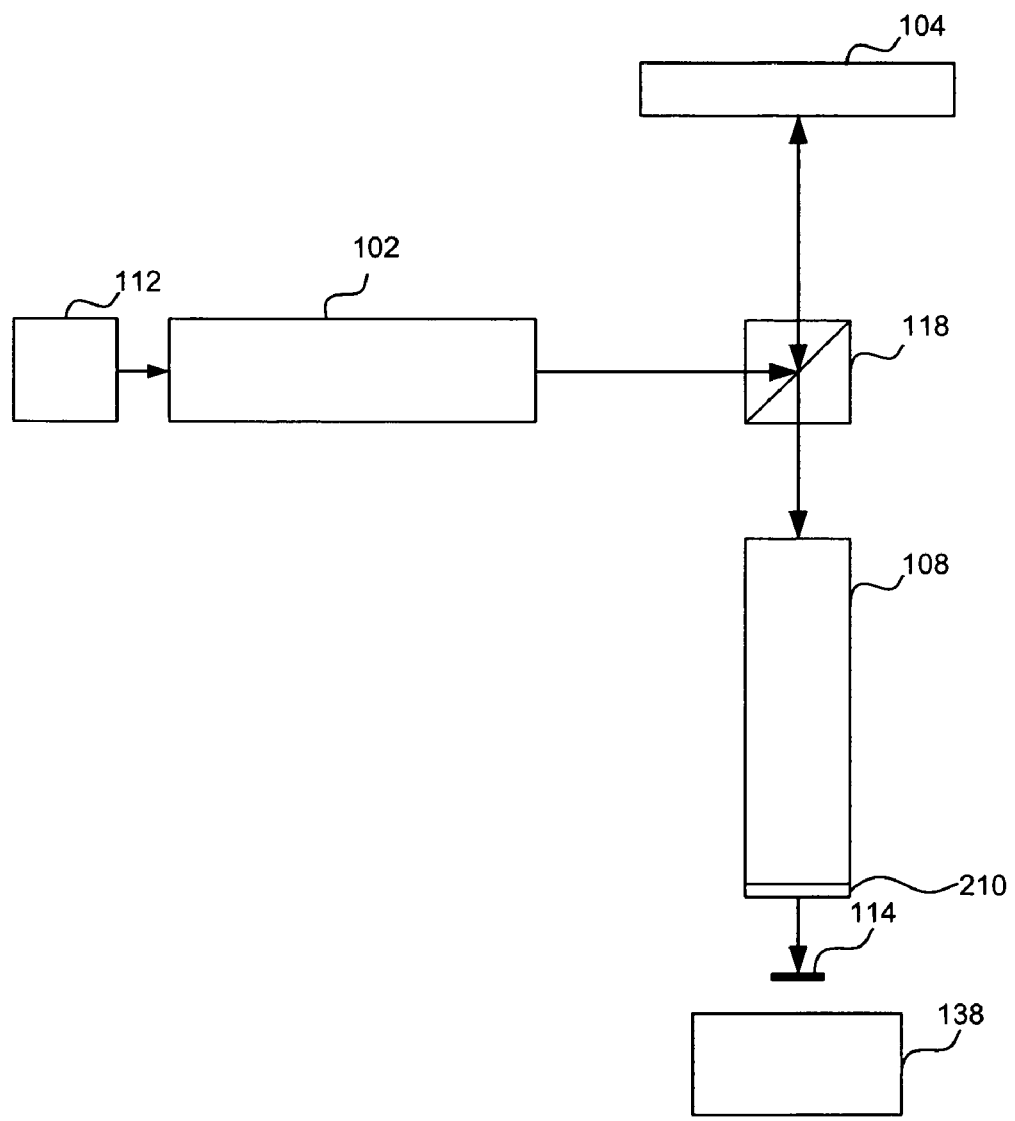
FIG. 2 is a diagram of a lithographic projection apparatus highlighting a wafer window, according to an embodiment of the invention.

FIG. 2 is a diagram of lithographic projection apparatus 100 that highlights an object window, according to an embodiment of the invention. FIG. 2 provides a simplified version of the diagram of lithographic projection apparatus 100 that was discussed with respect to FIG. 1. FIG. 2 highlights that lithographic projection apparatus 100 includes object window 210 between projection system 108 and substrate 114. (e.g., a resist coated silicon wafer or glass substrate).

In this example, pattern generator 104 includes multiple pattern generating devices that are aligned in columns. In other embodiments, pattern generator 104 can include a single pattern generating device. Multiple pattern generator layouts have a relatively small area per shot to be illuminated, compared to the size of the shot. The area is generally on the order of 10-20%, depending upon the packaging size and configuration of the pattern generator. Even when a custom field defining element and/or an aperture plate at the pattern generator is used to prevent illumination of the non-active areas, some light may scatter in the projection optics and reach these dark areas at the wafer plane.

Figure 3A:
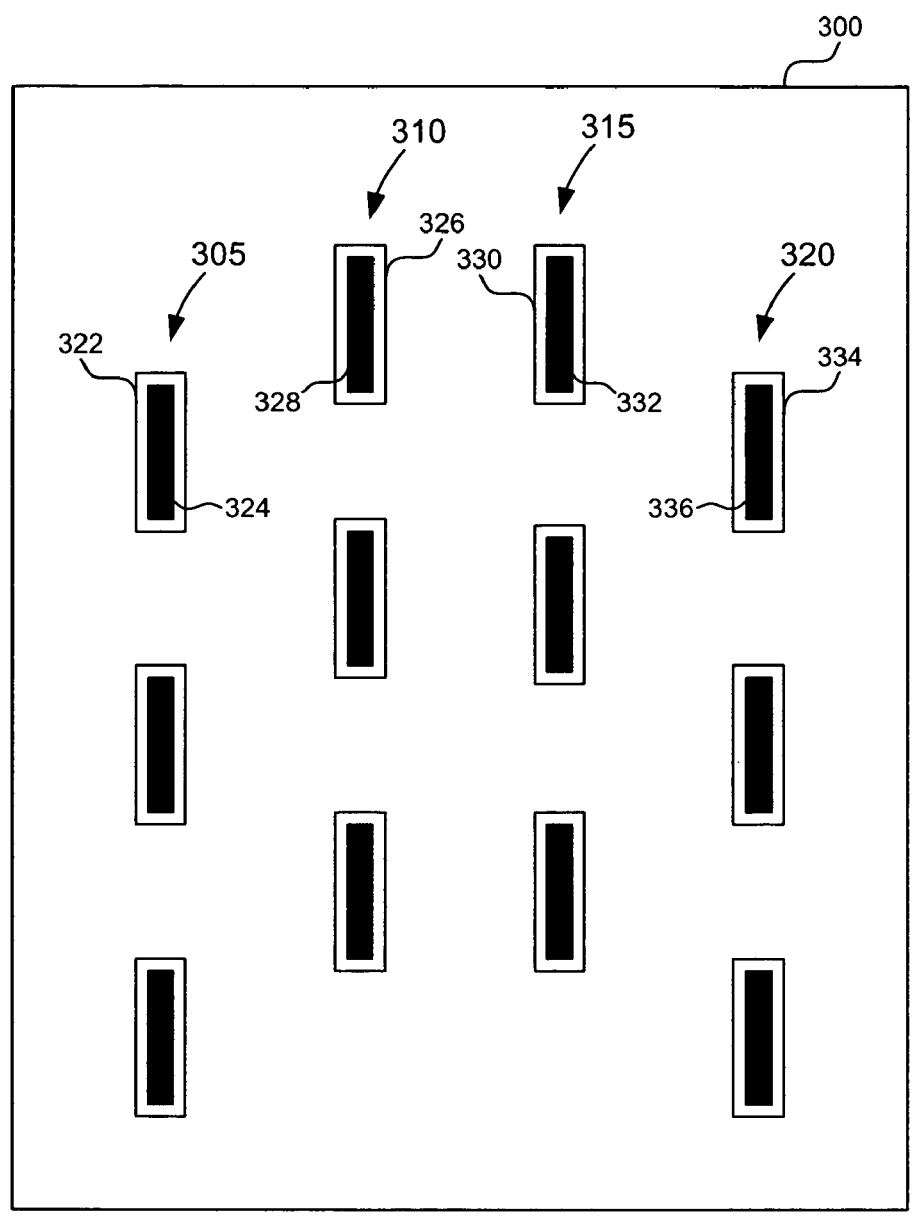
FIG. 3A is a diagram of a symmetric spatial light modulator (SLM) array layout, according to an embodiment of the invention.
Figure 3B:
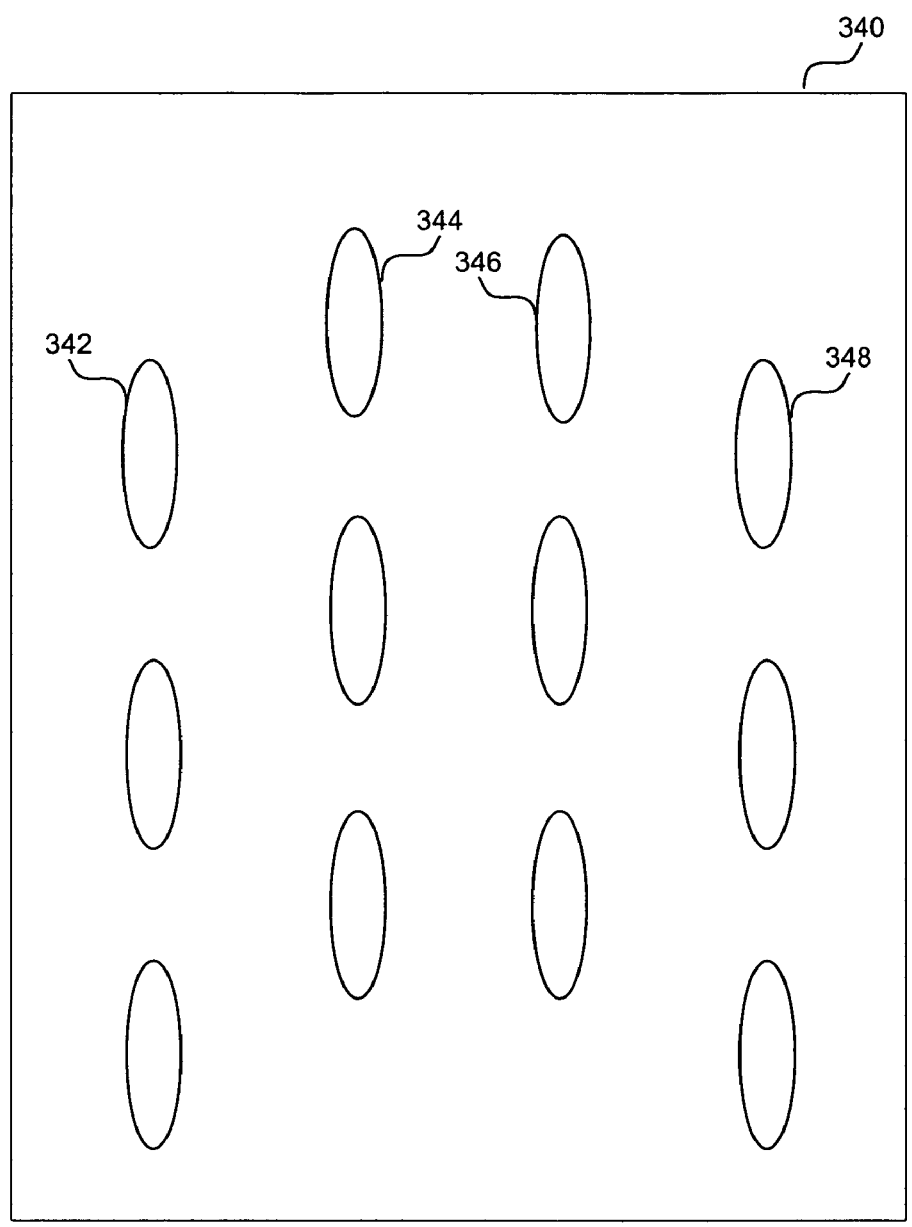
FIG. 3B is a diagram of an aperture profile matching a symmetric SLM array layout, according to an embodiment of the invention.
Figure 4A:
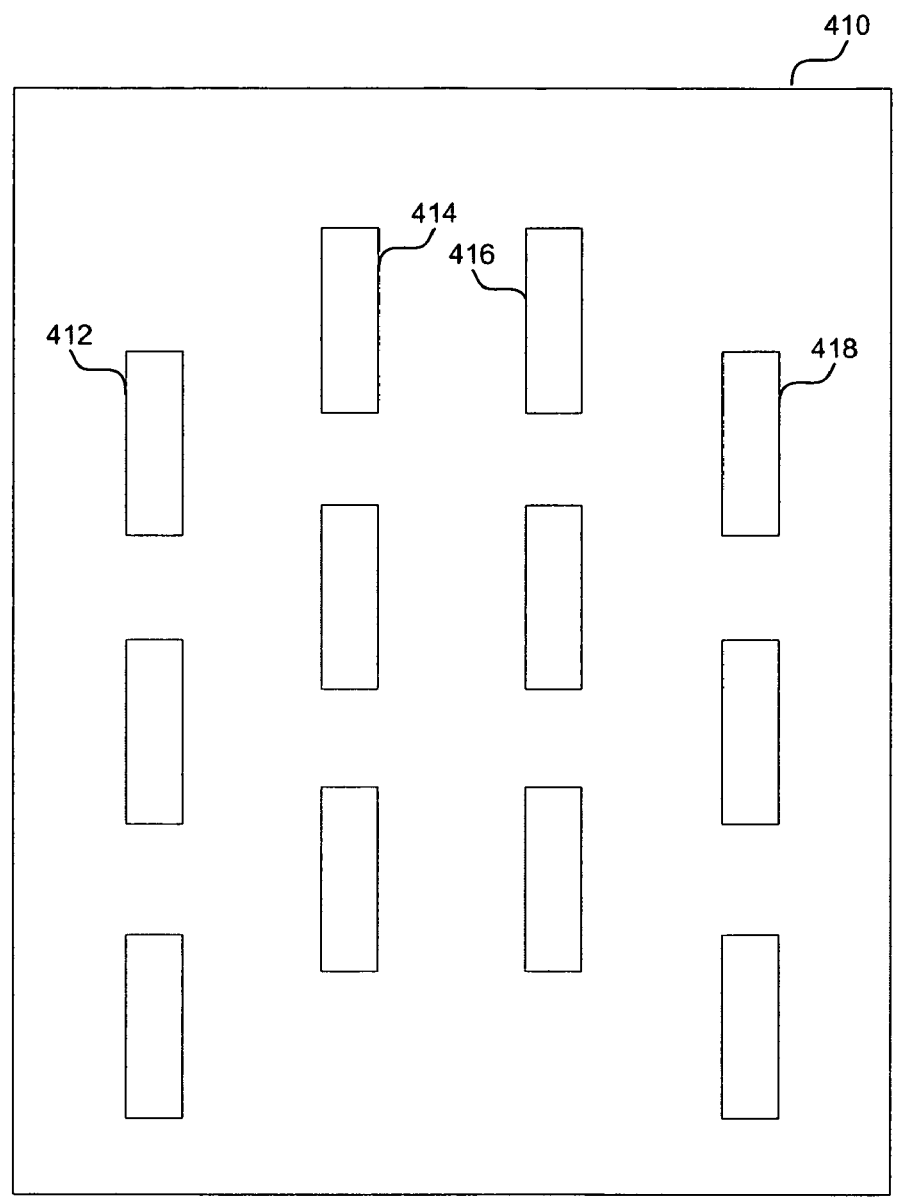
FIG. 4A is a diagram of an aperture profile matching a symmetric SLM array layout, according to an embodiment of the invention.

The invention places an aperture at or near object window 210 with a profile that matches the configuration of a multi-pattern generating devices layout. (e.g., a multi-SLM array layout as is depicted in FIG. 3A below). The aperture profile accounts for the magnification and numerical aperture (NA) of the projection optics. Example apertures are illustrated in FIGS. 3B and 4A below.

The aperture can be a standalone aperture plate located on or near object window 210. In an alternative embodiment the aperture can be lithographically printed and etched directly onto object window 210. This embodiment addresses the situation that the feature sizes of the aperture near object window 210 will be relatively small. The aperture can also be etched onto a window near an image plan or onto a lens within a projection optics system.

The placement of an aperture near object window 210 can reduce scattered light from a pattern generating device, such as pattern generator 104. Additionally, improvements can be achieved by maximizing the space between the column pairs of pattern generating devices to create a fairly large aperture between the column pairs where scattered light would be most detrimental. Additionally, this approach enhances the manufacturability of the aperture by keeping the SLM array shaped as separate tall, thin columns.

In this case, the spacing ratios between SLMs in the column pairs would still need to be properly controlled to ensure appropriate stitching, as would be known by individuals skilled in the relevant arts, based on the teachings herein. Furthermore, when SLMs are used as the pattern generating devices, the spacing should not exceed the maximum manufacturable lens diameter at the SLM plane.

FIG. 3A is a diagram of symmetric SLM array layout 300, according to an embodiment of the invention. SLM array layout 300 is an embodiment of pattern generator 104. Many layouts of pattern generating devices can be used for pattern generator 104, as will be known by individuals skilled in the relevant arts. The present example is provided for the purposes of illustration, and not intended to limit the scope of the invention. Rather, the invention covers the use of all types of multi-pattern generating device layouts.

SLM array layout 300 includes four columns of SLMs: SLM column 305, SLM column 310, SLM column 315 and SLM column 320. Each SLM column includes three SLMs. SLMs 322, 326, 330 and 334 represent the first SLM in each column respectively. SLM light reflecting portions 324, 328, 332 and 336 represent the portion of the SLM that reflects light. The non-light reflecting portions of the SLM include inactive areas, such as circuits, actuators, etc that can cause scattered or stray light to reach the object.

FIG. 3B is a diagram of aperture profile 340 matching the layout of the SLMs in SLM array layout 300, according to an embodiment of the invention. Aperture profile 340 would be located at or near object window 210, or etched directly onto wafer window 210. Aperture profile 340 includes four columns of openings that have been etched out corresponding to the SLMs in SLM columns 305, 310, 315 and 320. The openings 342, 344, 346 and 348 represent the top opening in each of the four columns of openings.

Figure 3C:
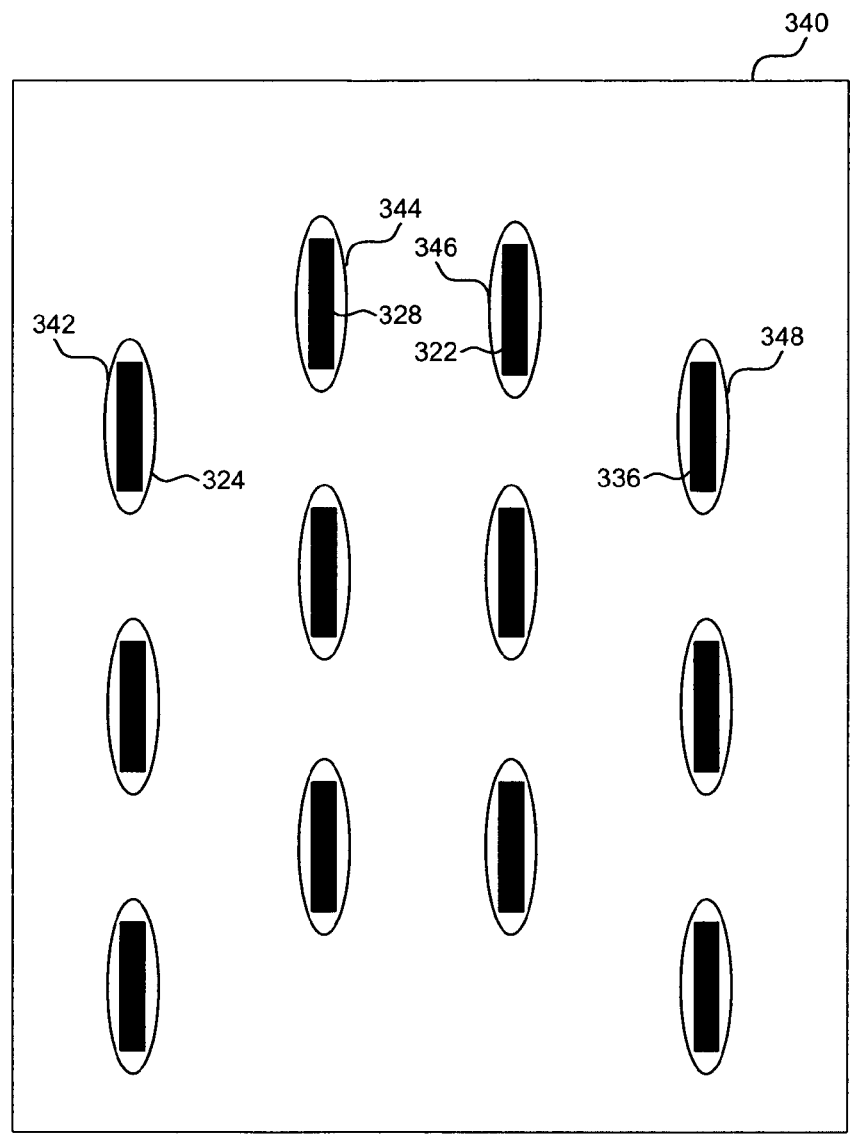
FIG. 3C is a diagram of an overlay of an aperture profile and a symmetric SLM array layout, according to an embodiment of the invention.

FIG. 3C is a diagram on an overlay of aperture profile 340 and SLM array layout 300, according to an embodiment of the invention. As seen in FIG. 3C, opening 342 corresponds to SLM light reflecting portion 324. Opening 344 corresponds to SLM light reflecting portion 328. Opening 346 corresponds to SLM light reflecting portion 322. Opening 348 corresponds to light reflecting portion 336. Aperture profile 340 will have an opening corresponding to each of the SLMs in SLM array layout 300, such that the opening reduce scattered light that impinges on the wafer or other work surface.

FIG. 4A is a diagram of another example of an aperture profile, aperture profile 410, that matches SLM array layout 300, according to an embodiment of the invention. Aperture profile 410 includes rectangular openings, such as openings 412, 414, 416, and 418, that are etched out, or removed in another way, to block scattered light. The other areas of aperture profile 410 will block scattered light.

Figure 4B:
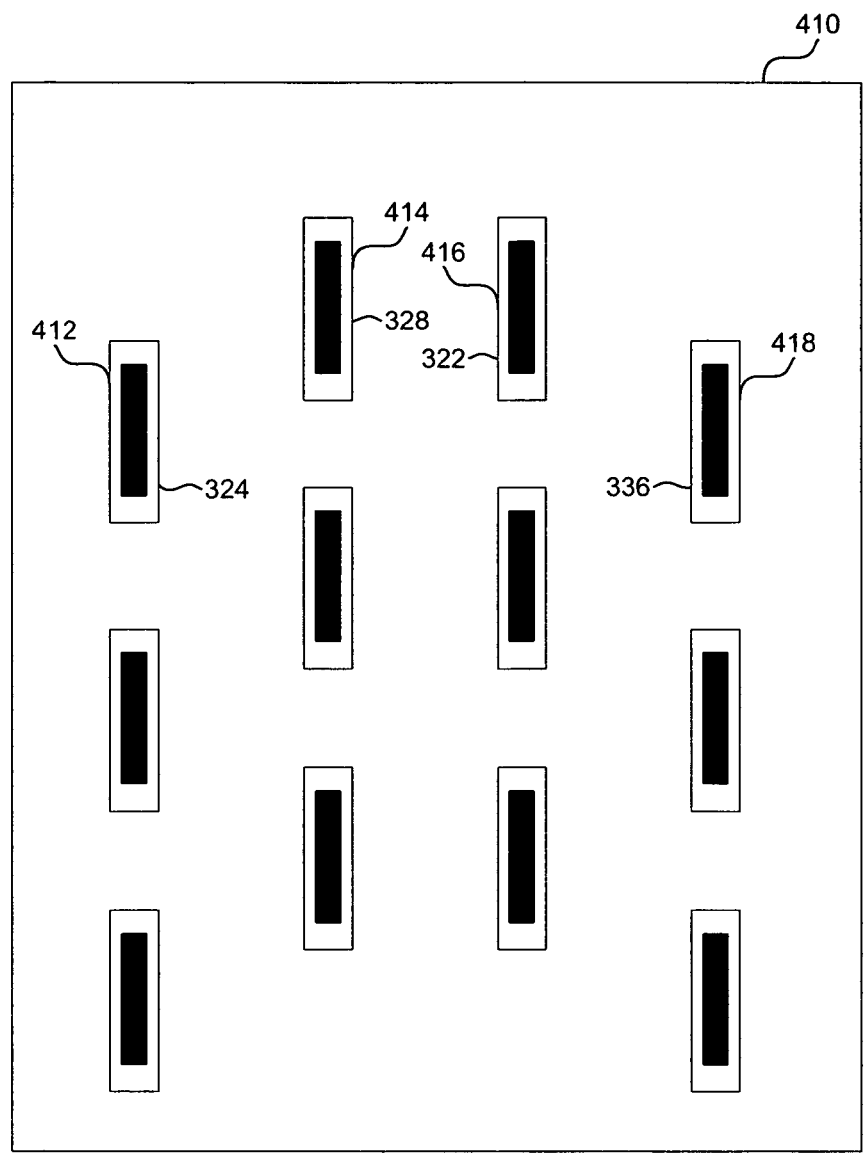
FIG. 4B is a diagram of an overlay of an aperture profile and a symmetric SLM array layout, according to an embodiment of the invention.

FIG. 4B. illustrates an overlay of aperture profile 410 onto SLM array layout 300, showing how aperture profile 410 can be used to block scattered light. Each of the rectangular openings, such as openings 412, 414, 416 and 418 correspond to an SLM light reflecting portions. For example, opening 412 corresponds to SLM light reflecting portion 324. Many types of aperture profiles can be designed, depending on the particular application, layout of SLMs, and other design considerations.

Figure 5:
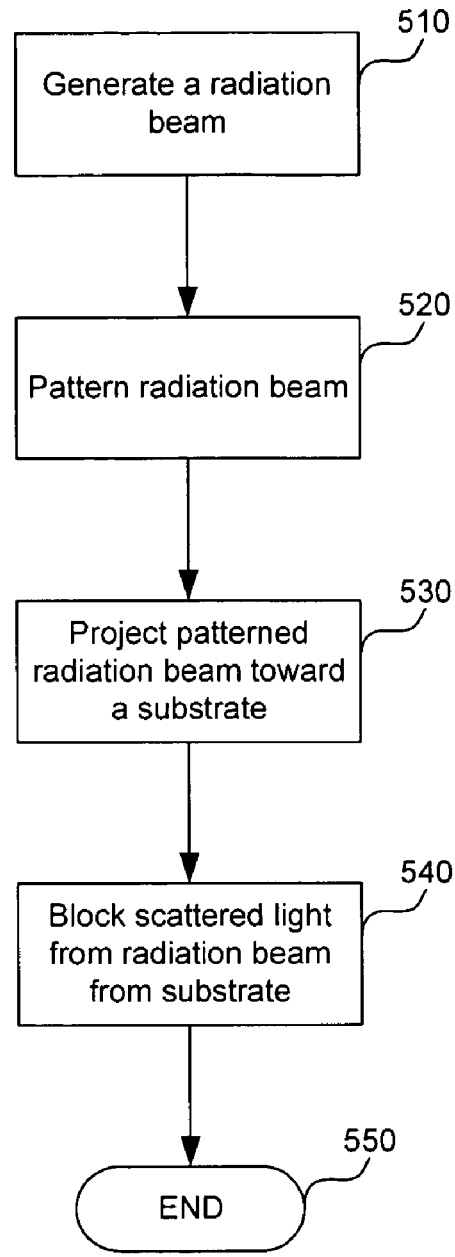
FIG. 5 is a flowchart of a method for reducing scattered light in a multi-pattern generating device maskless lithography system, according to an embodiment of the invention.

FIG. 5 is a flowchart of method 500 for reducing scattered light in a multi-pattern generating device maskless lithography system, according to an embodiment of the invention. Method 500 begins in step 510. In step 510 a radiation beam is generated. For example, source 112 can generate a radiation beam. In step 520 the radiation beam is patterned. For example, pattern generator 104 can generate a desired pattern. In step 530 the patterned radiation beam is projected toward a substrate. A substrate can include, for example, a wafer, a display device, a camera, a projection system display device or a projection television system display. For example, projection system 108 can direct a patterned radiation beam toward substrate 114. In step 540, scattered light from the radiation beam is blocked from reaching a substrate. For example, aperture 300 can be used to block scattered light, while allowing patterned radiation to pass and ultimately impinge upon substrate 114. In step 550 method 500 ends.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. A system, comprising:
   a plurality of patterning devices, each patterning device comprising a reflecting portion, the reflecting portion including an array of programmable elements that each are configured to produce a beam, and a non-reflecting portion, wherein respective beams form a patterned beam and wherein the non-reflecting portion is configured to produce stray beams;
   a projection system configured to direct the patterned beams onto a surface; and
   an aperture device comprising a number of openings, the number corresponding to a number of the patterning devices, the openings arranged in a configuration to correspond to locations of the patterning devices, the openings being arranged in a configuration to transmit the patterned beam, while substantially blocking the stray beams;
   wherein a spacing between adjacent ones of the elements in each of the array of programmable elements is smaller than a spacing between adjacent ones of the patterning devices.

2. The system of claim 1, wherein the patterning devices are spatial light modulators.

3. The system of claim 2, wherein said spatial light modulators are digital micromirror devices.

4. The system of claim 2, wherein said spatial light modulators are transmissive liquid crystal light valves.

5. The system of claim 2, wherein said spatial light modulators are grating light valves.

6. The system of claim 1, wherein said aperture device is an aperture plate.

7. The system of claim 1, wherein said aperture device is etched onto a window near an object plane of the projection system.

8. The system of claim 1, wherein said aperture device is etched onto a window near an image plane of the projection system.

9. The system of claim 1, wherein said aperture device is etched onto a lens within the projection system.

10. The system of claim 1, wherein the non-reflecting portions scatter incident light.

* * * * *